(12) United States Patent
Kondo et al.

(10) Patent No.: US 7,580,110 B2
(45) Date of Patent: Aug. 25, 2009

(54) EXPOSURE APPARATUS AND EXPOSURE METHOD

(75) Inventors: Hiroyuki Kondo, Saitama (JP); Takashi Miyachi, Kounosu (JP)

(73) Assignee: Nikon Corporation, Tokyo (JP)

( * ) Notice: Subject to any disclaimer, the term of this patent is extended or adjusted under 35 U.S.C. 154(b) by 40 days.

(21) Appl. No.: 12/007,096

(22) Filed: Jan. 7, 2008

(65) Prior Publication Data

US 2008/0116396 A1    May 22, 2008

Related U.S. Application Data

(62) Division of application No. 11/264,089, filed on Nov. 2, 2005, now Pat. No. 7,329,884.

(30) Foreign Application Priority Data

Nov. 8, 2004 (JP) ............... 2004-323247

(51) Int. Cl.
*H01L 21/27* (2006.01)
*G03B 27/54* (2006.01)
*G03B 27/27* (2006.01)

(52) U.S. Cl. ............ 355/35; 355/67; 250/492.22; 250/492.2; 250/504 R; 250/365; 313/231.61; 315/111.21

(58) Field of Classification Search ............ 355/35, 355/67; 250/492.22, 492.2, 504 R, 365; 313/231.61; 315/111.21
See application file for complete search history.

(56) References Cited

U.S. PATENT DOCUMENTS 6,268,906 B1    7/2001    Suzuki

| 6,603,533 | B2 * | 8/2003 | Go .......................... 355/71 |
| 6,825,481 | B2 * | 11/2004 | Miyake ............... 250/492.2 |
| 7,385,212 | B2 * | 6/2008 | Murakami ........... 250/504 R |
| 2003/0142198 | A1 | 7/2003 | Miyake |
| 2003/0142410 | A1 | 7/2003 | Miyake |
| 2005/0225739 | A1 | 10/2005 | Hiura |

FOREIGN PATENT DOCUMENTS

| JP | 2000-036456 | 2/2000 |
| JP | 2000-091195 | 3/2000 |
| JP | 2000-215998 | 8/2000 |
| JP | 2003-224052 | 8/2003 |
| JP | 2003-224053 | 8/2003 |
| JP | 2004-006716 | 8/2004 |

* cited by examiner

*Primary Examiner*—Nikita Wells
(74) *Attorney, Agent, or Firm*—Finnegan, Henderson, Farabow, Garrett & Dunner, L.L.P.

(57) ABSTRACT

An exposure apparatus and exposure method that produces plasma from a target material, generates pulsed light, and carries out exposure with the pulsed light.

In particular, a light emitting source generates pulsed light by producing plasma from an intermittently supplied target material. A reticle stage holds a reticle that is irradiated by the pulsed light. A photosensitive substrate stage holds a photosensitive substrate irradiated by the pulsed light patterned by the reticle. A control means controls the photosensitive substrate stage so that, before exposing the photosensitive substrate begins, the timing between an exposure starting point or an exposure ending point and the light emission timing are matched based on the drive timing of the photosensitive substrate stage and the light emission timing of the pulsed light.

3 Claims, 4 Drawing Sheets

EXPOSURE APPARATUS AND EXPOSURE METHOD

This is a division of application Ser. No. 11/264,089, filed Nov. 2, 2005, now U.S. Pat. No. 7,329,884 the contents of which are incorporated herein by reference.

TECHNICAL FIELD

The present invention pertains to an exposure apparatus; in particular, to an exposure apparatus and an exposure method that produces plasma from the target material, generates pulsed light, and carries out exposure with the pulsed light.

BACKGROUND OF THE INVENTION

Conventionally, in an exposure apparatus using pulsed light, a light emission instruction (trigger) is given from the exposure apparatus side to the light source and the light source generates a corresponding exposure light. That is to say, exposure operations are performed by the exposure apparatus side to output a trigger signal to the light source so that it coincides with the timing of the apparatus stage drive. By doing this, uniformity of exposure quantity can be obtained within the exposure field.

On the other hand, one kind of EUV light source uses the X-rays (EUV light) radiating from plasma produced from a target material which is supplied intermittently. As this type of light source, there is for example a droplet laser produced plasma X-ray source, which produces plasma by impinging laser light to the droplet target discharged from the tip of a nozzle. See Japanese Patent Application Publication No. 2000-215998 Official gazette However, in this type of light source, the moment at which EUV light is generated is dependent on the timing of supply of the target material, and is not related to timing used in the exposure apparatus. For this reason, even if the exposure apparatus outputs a trigger signal to the light source, the exposure apparatus does not generate light at the desired timing. This timing slip (delay) is at most the reciprocal of the repetition frequency of the light source. For example, if the repetition frequency is 1 kHz, the maximum delay is 1 ms.

For this reason, in the worst case, the number of pulses radiated at the scan starting point and scan end point within the exposure field is deficient by 1 pulse due to the delay between the start timing of movement of the exposure apparatus stage and the timing of EUV light generation, and uniformity of exposure within the field ends up deteriorating.

SUMMARY OF THE INVENTION

An object of the present invention is to provide an exposure apparatus and exposure method that can obtain good uniformity of exposure, even when an exposure light source produces a pulsed light by producing plasma from a target material An exposure apparatus according to an embodiment has a light emitting means that generates pulsed light by producing plasma from an intermittently supplied target material; a reticle stage on which is disposed a reticle that is irradiated by the pulsed light; a photosensitive substrate stage on which is disposed a photosensitive substrate which is irradiated by the pulsed light patterned by the reticle; and a control means that controls the substrate stage so that, before exposing the photosensitive substrate begins, the timing between exposure starting point or exposure ending point and the light emission timing are matched based on the drive timing of the photosensitive substrate stage and the light emission timing of the pulsed light.

An exposure apparatus according to an embodiment has a light emitting means that generates pulsed light by producing plasma from an intermittently supplied target material; a reticle stage on which is disposed a reticle that is irradiated by the pulsed light; a photosensitive substrate stage on which is disposed a photosensitive substrate which is irradiated by the pulsed light patterned by the reticle; and a control means that controls the light emission timing so that, before exposing the photosensitive substrate begins, the timing between exposure starting point or exposure ending point and the light emission timing are matched based on the drive timing of the photosensitive substrate stage and the light emission timing of the pulsed light.

An exposure apparatus according to an embodiment performs adjustment of the light emission timing by changing the phase of the pulsed light.

An exposure apparatus according to an embodiment performs adjustment of the light emission timing by changing the emission frequency of the pulsed light.

An exposure apparatus according to an embodiment detects in advance the light emission timing of the pulsed light by a detection means.

An exposure apparatus according to an embodiment defines the light emission timing of the pulsed light based on the target material supply timing of the supply means.

An exposure apparatus according to an embodiment defines the target material supply timing by detecting the timing of target material supply.

An exposure apparatus according to an embodiment defines the target material supply timing by a drive control signal for the supply means that supplies the target material.

An exposure apparatus according to an embodiment controls the photosensitive substrate stage drive with a fixed control period.

In an exposure apparatus according to an embodiment, the control means begins exposure by synchronizing the control period and the period of the pulsed light.

In an exposure apparatus according to an embodiment, the control means performs synchronization by delaying the moving start time of the photosensitive substrate stage.

In an exposure apparatus according to an embodiment, the control means sets the delay time of the moving start time of the photosensitive substrate stage to the minimum value.

An exposure method according to an embodiment includes exposing a pattern onto a photosensitive substrate using a light emitting means that generates a pulsed light by producing plasma from an intermittently supplied target material, and measuring the emission timing of the pulsed light before starting exposure of the photosensitive substrate.

An exposure method according to an embodiment includes defining the emission timing of the pulsed light based on the supply timing of the target material.

An exposure method according to an embodiment includes defining the light emission timing of the pulsed light by detecting the strength of the pulsed light.

An exposure apparatus according to an embodiment has a light emitting means that generates pulsed light by producing plasma from an intermittently supplied target material; a reticle stage on which is disposed a reticle that is irradiated by the pulsed light; a photosensitive substrate stage on which is disposed a photosensitive substrate which is irradiated by the pulsed light patterned by the reticle; and a control means that controls photosensitive substrate stage so that, before exposing the photosensitive substrate begins, the timing between exposure starting point or exposure ending point and the light emission timing are matched based on the drive conditions of the photosensitive substrate stage and the light-generation conditions of the pulsed light.

With the exposure apparatus of the present embodiments, the photosensitive stage may be controlled so that, before exposing on the photosensitive substrate begins, the timing between exposure starting point and exposure ending point and light emission timing are matched based on the drive timing of the photosensitive substrate stage and the light emission timing of the pulsed light, thus even in cases where pulsed light generated at the light source by producing plasma from the target material is used, good uniformity of exposure dose can be obtained.

With the exposure apparatus of the present embodiments, the light emission timing may be controlled so that, before exposing on the photosensitive substrate begins, the exposure starting point or exposure ending point and light emission timing are matched based on the drive timing of the photosensitive substrate stage and the light emission timing of the pulsed light, thus even in cases where pulsed light generated at the light source by producing plasma from the target material is used, good uniformity of exposure dose can be obtained.

With the exposure apparatus of the present embodiments, the photosensitive stage may be controlled so that, before exposing on the photosensitive substrate begins, the timing between exposure starting point and exposure ending point and light emission timing are matched based on the drive conditions of the induction substrate stage and the light-generation conditions of the pulsed light, thus even in cases where pulsed light generated at the light source by producing plasma from the target material is used, good uniformity of exposure dose can be obtained.

With the exposure apparatus of the present embodiments, pulsed light emission timing may be measured before start of exposure, thus even in cases where pulsed light generated at the light source by producing plasma from the target material is used, light emission timing can be grasped and it becomes possible to control exposure dose uniformity based thereon.

PREFERRED EMBODIMENTS OF THE INVENTION

Below we will explain details of embodiments of the present invention using drawings.

First Embodiment

Figure 1:
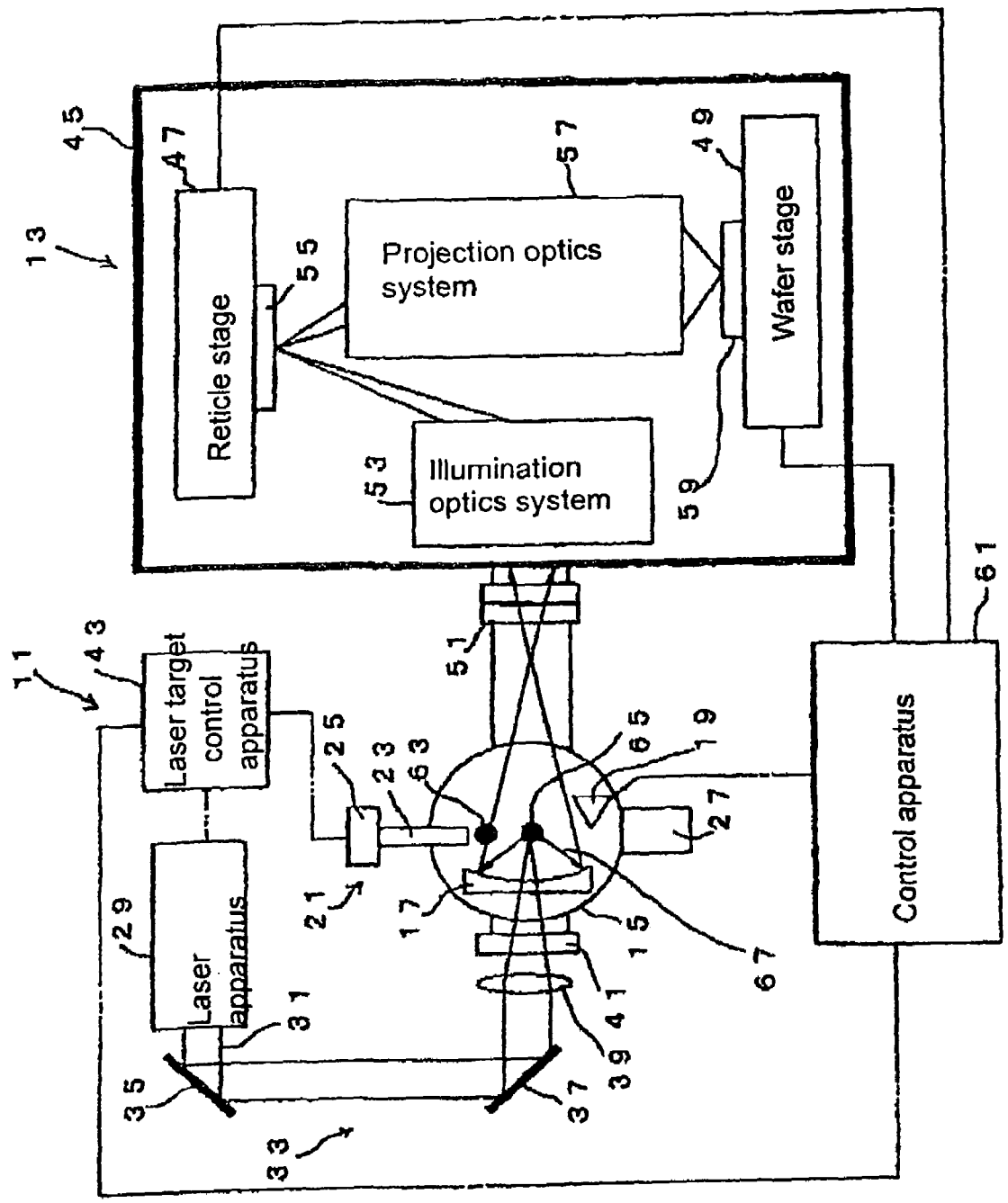
FIG. 1 is an illustration showing a first embodiment of the exposure apparatus of the present invention.

FIG. 1 shows the first embodiment of the exposure apparatus of the present invention. In this embodiment, a laser produced plasma X-ray source that uses droplet (droplet) targets is used as an exposure light source. The exposure apparatus of this embodiment has a EUV light generation part 11 and an exposure part 13.

EUV light generation part 11 produces plasma from the target material and generates pulsed light composed of EUV light. This EUV light generation part 11 has a vacuum chamber 15. Inside vacuum chamber 15 are disposed a condenser mirror 17 that reflects EUV light and an EUV light detection device 19 that detects EUV light.

On the upper side of vacuum chamber 15 is disposed a target material supply apparatus 21 that supplies target material. This target material supply apparatus 21 has a nozzle 23 that opens into vacuum chamber 15 and a supply part 25 that supplies target material to nozzle 23. On the lower side of vacuum chamber 15 is disposed a recovery mechanism 27 that recovers the target material.

On the side of vacuum chamber 15, a laser optics system 33 is disposed that guides laser light 31 from a laser apparatus 29 that generates laser light into vacuum chamber 15. Laser light 31 from laser apparatus 29, is reflected by reflective mirrors 35 and 37, condensed by lens 39, and directed into vacuum chamber 15 via a laser entry window 41 formed in vacuum chamber 15.

Laser apparatus 29 and supply part 25 of target material supply apparatus 21 are controlled by laser target material control apparatus 43.

Exposure part 13 has a vacuum chamber 45. Inside vacuum chamber 45 are disposed a reticle stage 47 and a wafer stage 49. EUV light generated by EUV light generation part 11 is directed from EUV light entry part 51 into an illumination optics system 53 inside vacuum chamber 45, and is guided onto the lower surface of a reticle 55 that is disposed on the lower side of reticle stage 47 by illumination optics system 53. The EUV light patterned and reflected by reticle 55 is irradiated via a projection optics system 57 onto a wafer 59 that is a photosensitive substrate mounted on the upper surface of wafer stage 49. In this embodiment, scanning exposure occurs by driving reticle stage 47 and wafer stage 49.

In FIG. 1, symbol 61 shows a control apparatus. This control apparatus 61 inputs signals from EUV light detection device 19 and laser target material control apparatus 43. In addition, drive control signals are input from reticle stage 47 and wafer stage 49. Then, reticle stage 47, wafer stage 49 and laser target material control apparatus 43 are controlled.

In the above exposure apparatus, droplet target 63 comprising liquefied xenon, for example, is intermittently discharged from the tip of nozzle 23 by supply part 25 of target material supply apparatus 21. When the discharged target 63 reaches a specified position (the focal point of condenser mirror 17), laser light 31 is emitted from laser apparatus 29, is condensed on target 63 via lens 39, and turns the target material into plasma.

EUV light 67 emitted from plasma 65 is condensed by condenser mirror 17 and directed to illumination optics system 53 of exposure part 13. The EUV light 67 emitted from illumination optics system 53 is incident onto reticle 55 of reticle stage 47 and is reflected. The reflected light from reticle 55 is incident into projection optics system 57 and forms an image of the fine pattern on reticle 55 onto wafer 59, which is coated with resist.

That is, the timing of laser apparatus 29 and supply part 25 of target material supply apparatus 21 is controlled by laser target control apparatus 43 so that laser light 31 irradiates target 63 when target 63 is located at a specified position (the focal point of condenser mirror 17). For example, they are controlled by adjusting the emission timing of laser light from laser apparatus 29 toward target 63. Note that this adjustment can be conducted for example by detecting the generation status of EUV light by means of a detection device such as EUV light detection device 19. In addition, the pulse period of the laser light emitted from laser apparatus 29 and the target material supply period (same as the period of target 63's passing through the focal point of condenser mirror 17) are adjusted so that they match the designed period.

Figure 2:
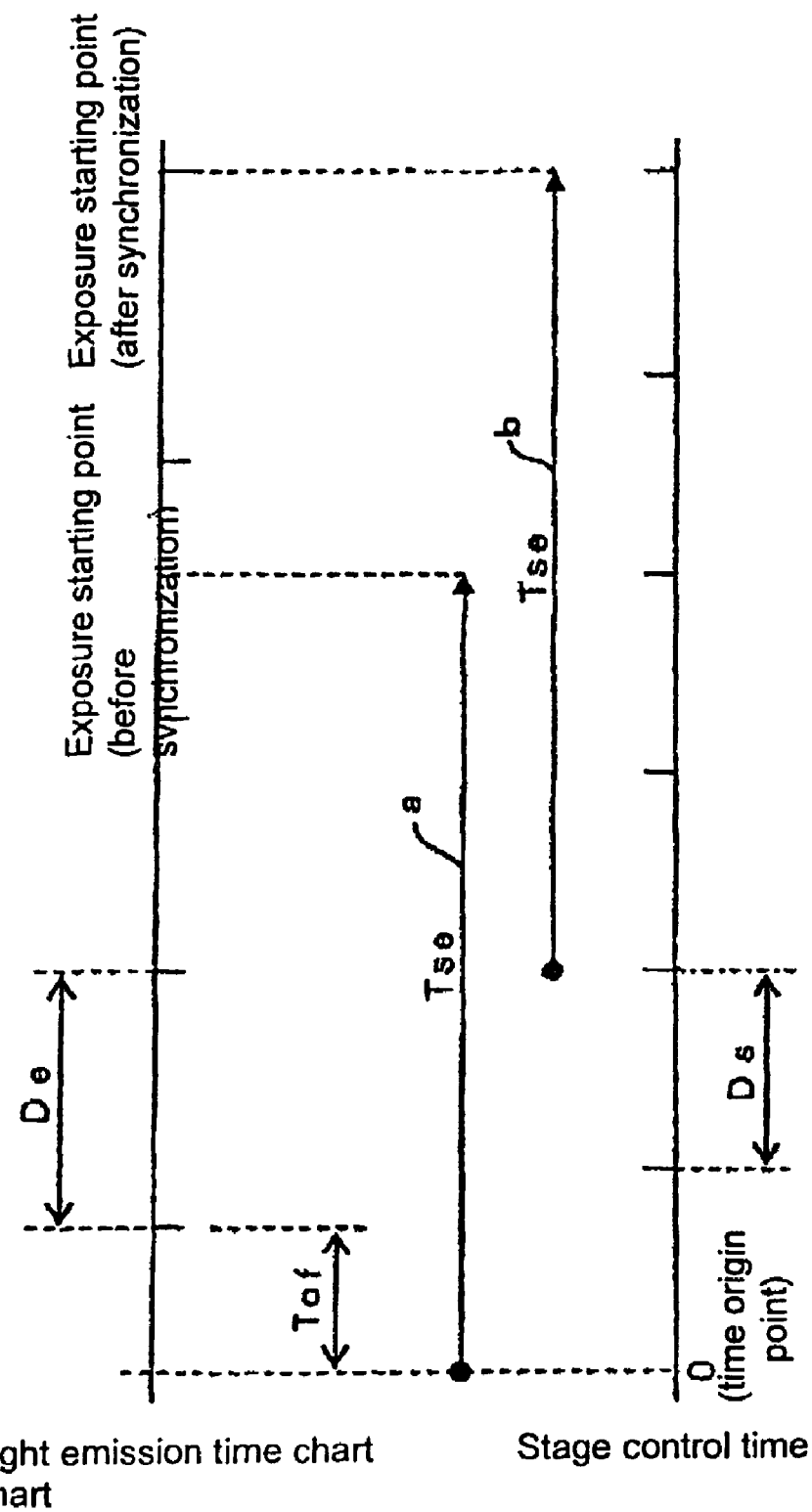
FIG. 2 is an illustration showing a wafer stage control time chart of the control apparatus of FIG. 1.

On the other hand, as shown in FIG. 2, orbital tracking control of wafer stage 49 is discrete, and the period of drive control thereof is Ds. In addition, the generation of the light from the plasma 65 is discrete, and the light-generation period of that EUV light (also called pulsed light) is De; these are not synchronized.

Then, in one shot of scanning exposure, the period Tse from the moving start of wafer stage 49 to start of exposure is already known at the time when the orbit of wafer stage 49 is generated. In addition, the drive control timing from just before start of moving is set to time origin 0, and it is possible to measure the difference in time Tof between this point and the point of generation of the pulsed light immediately after by some kind of hardware measurement means, so it is possible to know this in advance as well.

In this embodiment, in order to learn the difference in time Tof, plasma 65 is generated before start of exposure and the time delay between the light emission timing of the pulsed light and the drive control timing of wafer stage 49 is detected. This is performed by monitoring the pulsed light by EUV light detection device 19. In this embodiment, a photo diode is used in EUV light detection device 19. When pulsed light is generated, current (voltage) is output by the photo diode, and by monitoring this signal it is possible to learn the pulsed light emission timing. It is possible to learn Tof by looking up the time difference between the signal from this photo diode and the control period for drive control timing of wafer stage 49, which is used in the exposure apparatus.

Thus, when n is an integer, the emission timing Tf(n) of pulsed light is expressed by the following formula.

$$Tf(n)=n \times De + Tof$$

In addition, when m is an integer, drive control timing Ts(m) of the exposure start is expressed by the following formula.

$$Ts(m)=m \times Ds + Tse$$

As shown by the straight line a in FIG. 2, when the moving of wafer stage 49 is started at the initial time origin point 0, the pulsed light emission timing does not always match the timing when wafer stage 49 reaches the exposure starting point. In order make these coincide, the start of the moving of wafer stage 49 is delayed (drive control is discrete, therefore the delay is 1 sample for each Ds), as shown by straight line b in FIG. 2.

Thus, the minimum n and m such that |Tf(n)−Ts(m)|<Δ (Δ is the allowed time difference) is sought. By using this m, that is, by delaying the drive control timing of the moving start for wafer stage 49 only by an m sample from the previous time origin point 0, the pulsed light generation start point can be controlled (synchronized) so that it is brought adjacent to the exposure start point.

Note that the values of n and m grow too large depending on the values of period De and period Ds and the initial timing value, and there is a fear that it will take a long time to reach a state wherein exposure can start. In the case that this becomes a problem, it is possible to shift the light emission timing or the drive control timing of wafer stage 49 (the phase, in other words) in advance and synchronize so that the values of n and m are minimized. As a means to shift the phase, it is possible to use methods such as changing the orbit start position (initial position) or adjusting the orbit generation parameters (degree of acceleration), for example.

In the above exposure apparatus, before starting of exposing the wafer 59, timing for the start of movement of wafer stage 49 is controlled so that the exposure starting point and the light emission timing coincide (synchronized), based on the drive control timing of wafer stage 49 and the pulsed light emission timing; thus even in cases where pulsed light generated by producing plasma from the target material at the light source is used, good uniformity of exposure dose can be obtained. The term "coincide (synchronized)" as used here means that a time difference is allowable to the extent that there is no specification problem for the apparatus.

That is to say, by reducing the gap between the start time of exposure of wafer stage 49 and the pulsed light emission time, it is possible to constantly make the number of pulses in the scanning start part within the exposure field a fixed number of pulses, the essence being to create uniform exposure dose within the field.

Note that in the above exposure apparatus the EUV light emission timing is detected using EUV light detection device 19; however, it is acceptable to detect the light emission timing with another method. For example, as stated above, it is possible to adjust so that the supply timing of target 63 and the pulse timing of the pulsed laser light used for plasma excitation that is emitted from laser apparatus 29 are synchronized. In this sort of case, it is possible to control the light emission timing of laser light from laser apparatus 29 as if it were the light emission timing of EUV light. When such control is performed, in the case that the light generation period of laser light from laser apparatus 29 differs from the supply period of target 63, it is preferable to take this difference into consideration.

Second Embodiment

Figure 3:
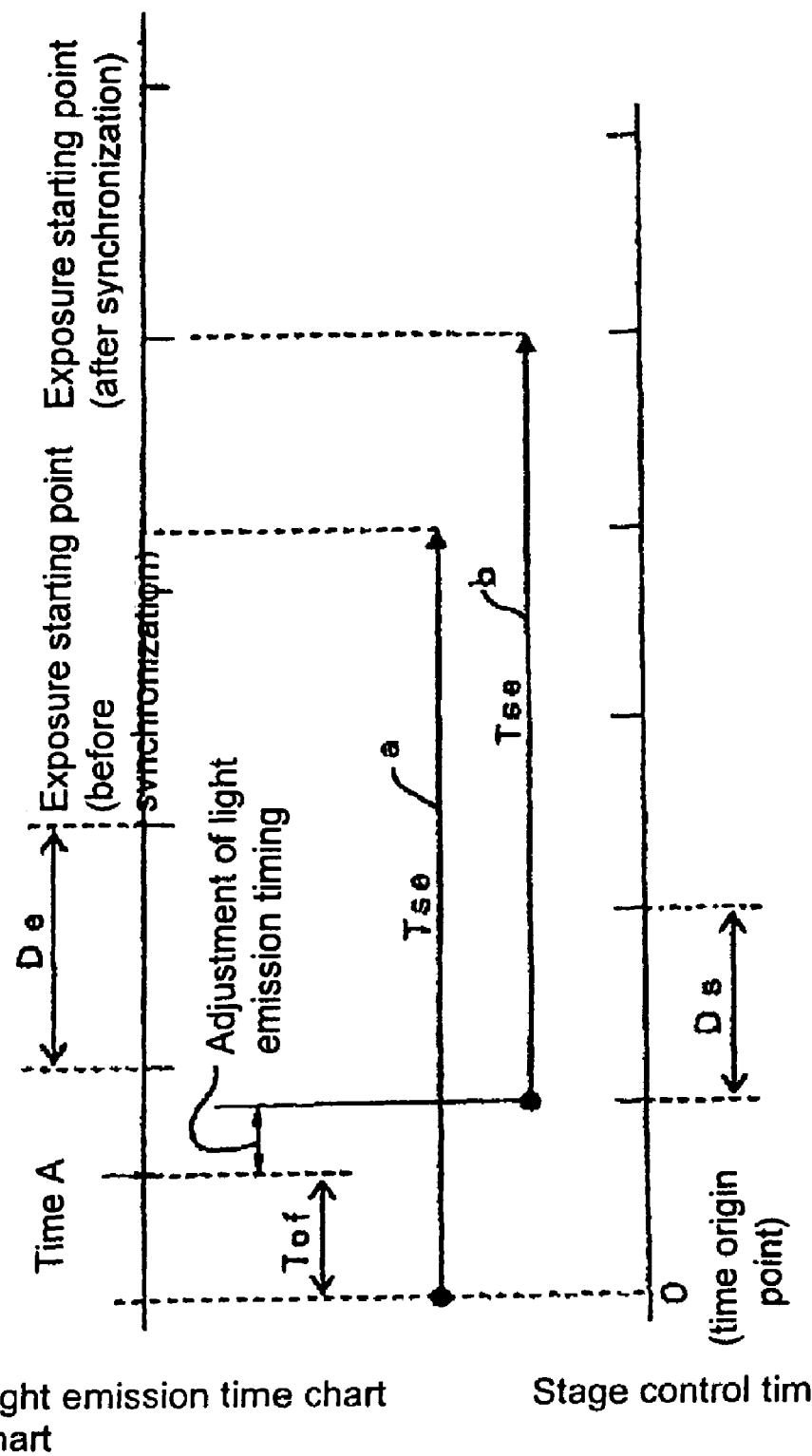
FIG. 3 is an illustration showing a wafer stage control time chart in embodiment 2 of the exposure apparatus of the present invention.

FIG. 3 shows a timing chart of a second embodiment of the exposure apparatus of the present invention.

Note that in this embodiment, the same members as in the first embodiment are assigned the same symbols, so detailed explanation has been omitted.

In this embodiment, the light emission timing is adjusted based on the drive control timing of wafer stage 49 and the light emission timing of the pulsed light, making the start of exposure and the light emission timing coincide.

In this embodiment, the adjustment of the light emission timing is conducted by changing the phase of the pulsed light. That is to say, control apparatus 61 detects the delay amount Tof between the drive control timing of wafer stage 49 and the pulsed light emission timing at time A in FIG. 3 (same as the first embodiment). Then, based on this result, how much of a shift in pulsed light emission timing is necessary to coincide with the drive control timing of wafer stage 49 in the least amount of time is measured. Then, this calculation result is fed back to laser target material control apparatus 43. By this means, the discharge timing of target 63, discharged from nozzle 23 by supply part 25 of target material supply apparatus 21, is changed and the pulsed light emission timing (phase) is shifted (in the drawing, the timing from light generation at time A to the next light generation is adjusted). Note that in this embodiment, the light emission frequency of the pulsed light (the repetition frequency) is not changed.

In this embodiment as well, an effect similar to that of the first embodiment can be obtained, but in this embodiment, as compared to the first embodiment, the drive control timing of wafer stage 49 and the pulsed light emission timing can be made to coincide in a shorter period of time. Accordingly, wait time is reduced and throughput of the exposure apparatus can be improved.

Note that in this embodiment we explained an example of shifting the pulsed light emission timing (phase), but it is also acceptable to change the light emission frequency of the pulsed light (repetition frequency).

That is to say, in the case where the number of pulses of pulsed light irradiating one point on wafer 59 is sufficiently large and uniformity of the exposure is adequate, there is no problem in changing slightly the light emission frequency of the pulsed light. Accordingly, in this sort of case, it is acceptable to change the light emission frequency of the pulsed light so that the drive control timing of wafer stage 49 and the pulsed light emission timing coincide. In addition, it is possible to change the phase and frequency of the stage drive control timing.

Embodiment 3

Figure 4:
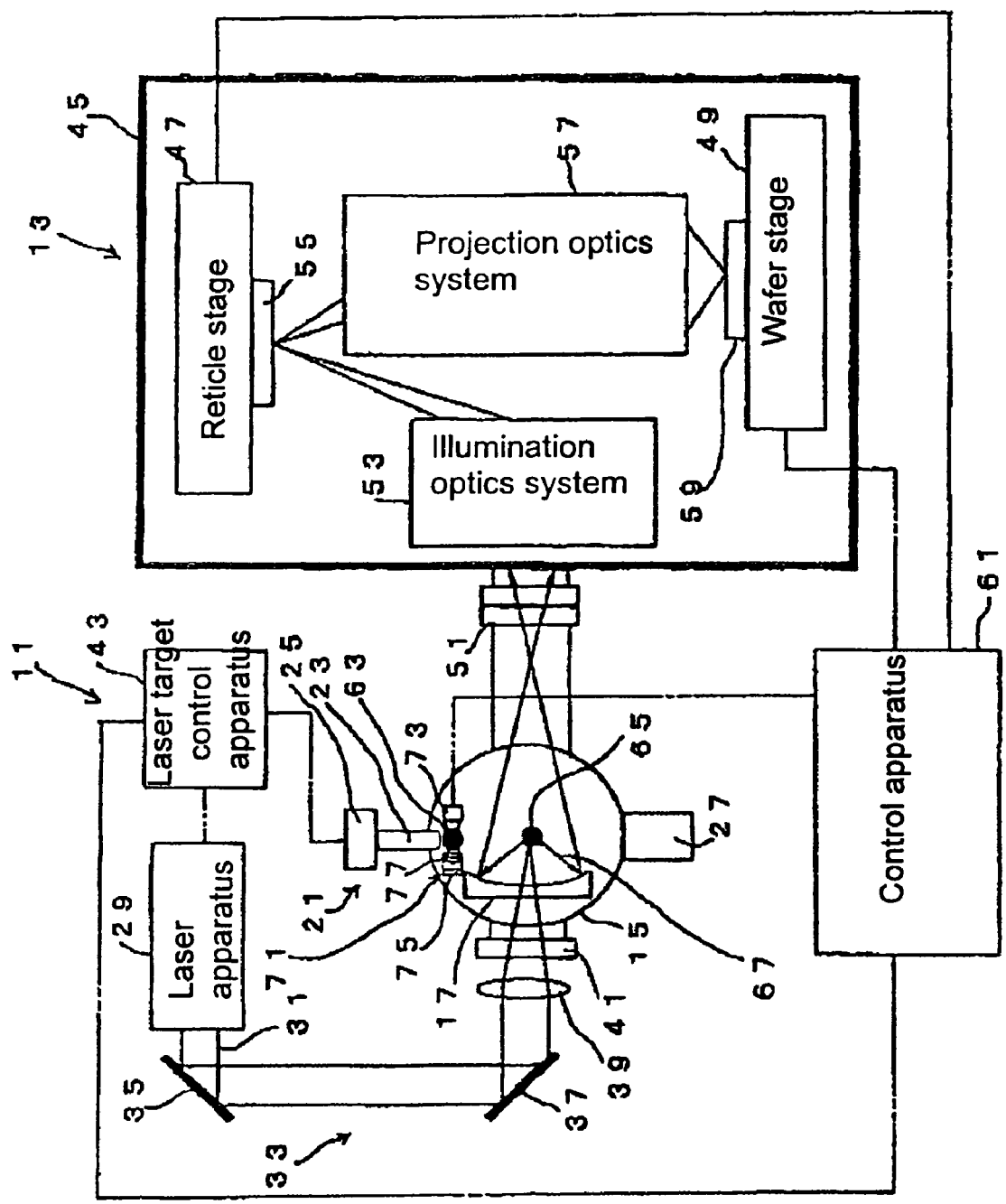
FIG. 4 is an illustration showing a third embodiment of the exposure apparatus of the present invention.

FIG. 4 shows a third embodiment of the exposure apparatus of the present invention.

Note that in this embodiment, the same members as in the first embodiment are assigned the same symbols, so detailed explanation has been omitted.

In this embodiment, the pulsed light emission timing is monitored by monitoring the timing of target material discharge from nozzle 23.

That is to say, in this embodiment, a light irradiation device 71 is disposed on one side of the passage location of target 63, and a light detection device 73 is disposed facing light irradiation device 71. Light irradiation device 71 has a light emitting diode 75 and a focusing lens 77. The light emitted from light emitting diode 75 is designed so as to be focused by focusing lens 77 at the location of passage of target 63. At the moment target 63 passes, the light from light emitting diode 75 is interrupted by target 63 and is scattered; thus the amount of light detected by light detection device 73 drops, and the magnitude of the output signal from light detection device 73 drops.

Accordingly, by monitoring the output signal from light detection device 73, the moment that target 63 passes can be monitored. Then, because the period from the passage of target 63 until target 63 generates light is fixed, the pulsed light emission timing can be estimated from the output signal of light detection device 73.

In this embodiment as well, an effect similar to the first embodiment can be obtained.

Note that in this embodiment we explained an example where the moment of passage of target 63 is monitored by light detection device 73; however, it is also acceptable to estimate the pulsed light emission timing from the material supply signal to target material supply device 21 by defining the correlation between the material supply signal output from laser target material control apparatus 43 to supply part 25 of target material supply apparatus 21, and the timing of the dropping of the target material.

For example, when a pulse voltage is applied to supply part 25 of target material supply apparatus 21, droplets drop in response at a specified response time from nozzle 23. Accordingly, by measuring in advance the time difference from the moment of application of pulse voltage to the generation of the pulsed light, the moment of pulsed light emission can be learned by knowing the timing of application of the pulse voltage.

Supplemental Items for the Embodiments

In the above we explained the present invention by means of the above embodiments, but the technical scope of the present invention is not limited to the above embodiments. For example, the following modifications are acceptable.

(1) For the above embodiment, we explained an example where the exposure starting point and the pulsed light emission point are synchronized, but it is also acceptable to synchronize the exposure ending point and the pulsed light emission point. Which of the constraints is important is determined by the form of the exposure shot, etc. In the case that both cannot be synchronized, it is preferable to control so that only the more important is synchronized. For example, it is better to determine which to prioritize by the existence of patterns adjacent to the edge of the shot or the existence of patterns where more uniformity of illumination is demanded, etc.

(2) For the above embodiment, we explained an example where the pulsed light emission timing is monitored by EUV light detection device 19; however, for example, it is also acceptable to monitor by a light detection device having sensitivity in the visible light and infrared light regions. That is to say, because ultraviolet rays, visible light and infrared light are generated from plasma 65 at the same time as EUV light 67, the light emission timing of EUV light 67 can be learned by monitoring these.

(3) For the above embodiment, we explained an example using a laser produced plasma light source as the light source for EUV 67; however, for example, it is acceptable to use a discharged produced plasma X-ray source that generates EUV light by intermittently supplying target material between electrodes and issuing a coinciding electrical discharge. In addition, as methods of intermittent supply of target material, there are methods such as intermittent discharge of gas between electrodes or supply of target material in liquid form or as small particles between the electrodes.

(4) For the above embodiment, we explained an example using xenon droplets as the target material; however, it is acceptable for example to use tin (Sn). In this case, it is preferable for example to use solid small particles of Sn dispersed in polystyrene resin heated to liquid form.

(5) For the above embodiment, we synchronized the control timing of the photosensitive substrate stage and the light emission timing; however, in the same manner, it is possible to synchronize the control timing of the reticle stage and the light emission timing.

We claim:

1. An exposure method for exposing a pattern on a photosensitive substrate using a light source that generates a pulsed light by producing plasma from an intermittently supplied target material, the method comprising:
   measuring the emission timing of the pulsed light before starting exposure onto the photosensitive substrate.

2. The exposure method described in claim 1, further comprising:
   defining the emission timing of the pulsed light based on the supply timing of the target material.

3. The exposure method described in claim 1, further comprising:
   defining the emission timing of the pulsed light by detecting the strength of the pulsed light.

* * * * *